United States Patent
Pu et al.

[11] Patent Number: 5,740,009
[45] Date of Patent: Apr. 14, 1998

[54] APPARATUS FOR IMPROVING WAFER AND CHUCK EDGE PROTECTION

[75] Inventors: Bryan Pu; Hongching Shan, both of San Jose; Kuang-Han Ke, Mountain View; Michael Welch, Livermore; Semyon Sherstinsky, San Francisco; Alfred Mak, Union City; Ling Chen, Sunnyvale; Sue Zhang, Milpitas; Leonel Arturo Zuniga, San Jose; Samuel C. Wilson, Sunnyvale, all of Calif.

[73] Assignee: Applied Materials, Inc., Santa Clara, Calif.

[21] Appl. No.: 758,531

[22] Filed: Nov. 29, 1996

[51] Int. Cl.⁶ ............................................. H02N 13/00
[52] U.S. Cl. ............................................. 361/234
[58] Field of Search ............................. 361/233, 234; 279/128

[56] References Cited

U.S. PATENT DOCUMENTS

| | | | |
|---|---|---|---|
| 5,055,964 | 10/1991 | Logan et al. | 361/234 |
| 5,452,177 | 9/1995 | Frutiger | 361/234 |
| 5,486,975 | 1/1996 | Shamouilian et al. | 361/234 |
| 5,535,507 | 7/1996 | Barnes et al. | 361/234 |
| 5,636,098 | 6/1997 | Salfelder et al. | 361/234 |

*Primary Examiner*—Fritz Fleming
*Attorney, Agent, or Firm*—Thomason & Moser

[57] ABSTRACT

Apparatus for retaining a wafer having improved wafer and chuck edge protection, contains an protection ring that circumscribes a pedestal and is biased to be in constant contact with the backside of the wafer. A biasing element uniformly biases the protection ring into contact with the circumferential edge of the wafer. The protection ring has an annular plan form that circumscribes an electrostatic chuck for retaining the wafer in a stationery position. Vertical travel of the ring is restricted by a hard stop that is formed by a portion of a focus ring which overhangs the protection ring. After a wafer is placed upon the chuck and the chucking force enabled, the chucking force easily overcomes the bias force upon the protection ring and the wafer rests upon the chuck support surface. The protection ring contacts the backside of the wafer to ensure that pedestal and electrostatic chuck are not exposed to the plasma and, when a silicon protection ring is used, the effective area of the wafer is extended beyond the physical dimensions of the wafer to facilitate a more uniform plasma distribution over the wafer.

24 Claims, 3 Drawing Sheets

5,740,009

APPARATUS FOR IMPROVING WAFER AND CHUCK EDGE PROTECTION

BACKGROUND OF THE INVENTION

1. Field of the Invention

The present invention relates to apparatus used to secure semiconductor wafers (or substrates) in plasma processing chambers within semiconductor wafer processing systems. More particularly, the invention relates to such apparatus having improved wafer and chuck edge protection.

2. Description of the Background Art

Electrostatic chucks are widely used for retaining wafers within process chambers of semiconductor wafer processing systems. An electrostatic chuck generally contains a pedestal supporting a dielectric layer having an imbedded electrode or electrodes. To produce a clamping force between the wafer and a wafer support surface of the chuck, the electrode is connected to a high voltage, DC power supply. The chuck assembly is typically positioned centrally within a process chamber for accomplishing chemical vapor deposition (CVD), physical vapor deposition (PVD), or etch processes. To facilitate the efficient use of these processes, a plasma is formed in the process chamber proximate the surface of the process wafer. To generate such a plasma, a process gas is introduced into the process chamber and a substantial amount of energy is coupled to the process gas to form the plasma. The energy is typically supplied by an antenna surrounding the process chamber and powered by an RF power source or a high AC or DC voltage applied between the grounded chamber walls and the pedestal supporting the electrostatic chuck.

In operation, a wafer is placed upon the support surface of the chuck, a process gas is introduced in the process chamber, the plasma is ignited by coupling the plasma generating energy to the process gas, and, lastly, a chucking voltage is applied to the electrostatic chuck electrode. Typically, the chucking voltage is applied between the electrode and the grounded process chamber walls. As such, the plasma, being conductive, refers the wafer to the chamber walls with a small voltage drop across dark space regions that are formed between the wafer and the plasma, and the plasma and the chamber walls. Consequently, charge accumulates on the support surface of the dielectric layer and on the wafer surface that faces the support surface. The charges on each surface are oppositely polarized. As a result, Coulomb forces attract the charges and retain the wafer on the support surface of the chuck.

FIG. 1 depicts a simplified cross-sectional view of a portion of an electrostatic chuck 100 having a support surface 122 supporting a process wafer 102. The illustrative electrostatic chuck 100 includes a pedestal 104 supporting a flex circuit 124. The flex circuit 124 consists of a thin conductive layer 126, e.g., copper, sandwiched between upper and lower dielectric layers 110 and 112. The dielectric layers are typically formed of polyimide or some other flexible dielectric material. The flex circuit has thickness of between six and nine mils (0.15 to 0.23 mm) thick. This laminant-type electrostatic chuck is disclosed in U.S. patent application Ser. No. 08/410,449, filed Mar. 27, 1996.

This circuit is adhered to the top surface of the pedestal 104 using an adhesive such as phenolic butyral. The pedestal is typically aluminum, but can be fabricated of other materials such as stainless steel. Additionally, the pedestal includes a backside gas conduit 114 and the support surface contains gas distribution channels (not shown) such that backside coolant gas (e.g., helium) is supplied, via conduit 114, through the pedestal and the flex circuit 124. Typically the flex circuit 124 has a diameter that is 4 to 10 millimeters smaller than the diameter of a process wafer such that the wafer completely covers the surface of the polyimide dielectric material layer. As such, the wafer protects the polyimide from exposure to the plasma.

Other conventional components of the process chamber that function in cooperation with the electrostatic chuck included a insulating ring 106 and a focus ring 108. In some instances, the insulating ring and focus ring are fabricated as a single component. The insulating ring 106 having an annular plan form rests upon the pedestal 104 and circumscribes the flex circuit 124. The focus ring 108 also having an annular plan form rests upon the insulating ring 106 and circumscribes the chuck 100 and wafer 102.

The portion of the wafer 102 that overhangs the edge 116 of the flex circuit is generally spaced apart from the focus ring 108, the insulating ring 106 and the pedestal 104. As such, a radial gap 118 is formed between the pedestal 104 and the insulating ring 106 (e.g., a gap of between 5 and 15 mils. (0.12–0.38 mm in width)). Additionally, a vertical gap 120 is formed between the backside of the wafer and the insulating ring (e.g., a gap of 2 to 5 mils. (0.05–0.12 mm in width)). Detrimentally, the plasma penetrates these gaps. More specifically, during processing, the portion of the backside of the wafer that overhangs the flex circuit, the edge of the flex circuit, and a portion of the pedestal adjacent to the gap 118 are exposed to the plasma. This exposure damages the surfaces that are contacted by the plasma. Because the polyimide is damaged by plasma contact, the electrostatic chuck will have a shorter life span than if the plasma did not contact the flex circuit. Additionally, the portion of the pedestal that is contacted by the plasma becomes a source of contaminant particles. Additionally, when the plasma contacts the backside of the wafer, devices that otherwise would be formed near the wafer edge are damaged and thus the yield of the semiconductor wafer processing system is reduced.

In etching processes, polymer detrimentally penetrates to the backside of the wafer and is deposited upon the backside overhang and other surfaces defining the gaps 118 and 120. Such deposition requires long cleaning delays to sufficiently remove the polymer depositions. Also, as a plurality of wafers are sequentially etched, polymer depositions accumulate near the edge of the chuck until a wafer cannot seal properly and backside cooling gas leaks into the process chamber. Such leakage causes undesirable temperature non-uniformities that can impact wafer yield.

Therefore, there is a need in the art for an improved electrostatic chuck that reduces the exposure of the backside of the wafer to the plasma and eliminates the exposure of the pedestal and flex circuit to the plasma and/or polymer deposition.

SUMMARY OF THE INVENTION

The disadvantages heretofore associated with the prior art are overcome by an improved electrostatic chuck for use in a semiconductor wafer processing system. The improved chuck greatly enhances the wafer and chuck edge protection due to implementing a so-called "zero gap" technique. The invention eliminates plasma penetration under the wafer by providing a constant, low force contact between a spring supported protection ring and the backside edge of the wafer. The protection ring is fabricated from a ceramic, silicon or other plasma resistant material.

More specifically, the improved electrostatic chuck contains a protection ring having an annular plan form that circumscribes the flex circuit. The annular ring has a diameter that is slightly less than the diameter of a wafer. The ring is biased to be in constant contact with the backside edge of the wafer. The chuck further contains an aluminum pedestal having a flex circuit mounted centrally upon the pedestal. The flex circuit contains an electrode or electrodes imbedded in a dielectric layer. The protection ring is typically upwardly biased away from the pedestal by a plurality of springs distributed about the circumferential edge of the electrostatic chuck such that a uniform bias force is applied by the ring to the circumference of the wafer.

As an alternative bias element, several elastomer rings or a single elastomer ring are positioned in a channel formed in the pedestal. The channel surrounds the flex circuit and has a diameter equivalent to the diameter of the protection ring(s). When the wafer is chucked, a lip seal on each elastomer ring abuts the underside of the protection ring forming a seal.

In an alternative embodiment of the invention, no matter what form of biasing element is used, vertical travel of the protection ring is restricted by a hard stop that is formed by a portion of a focus ring which overhangs the protection ring. As such, maximum elevation of the top surface of the protection ring above the flex circuit is limited to 2 to 4 mils (0.05–0.10 mm). Additionally, the total force of the biasing element on the protection ring is approximately 1.5 to 3 pounds at the loading height of the protection ring. Consequently, after a wafer is placed upon the chuck and the chucking force applied, the chucking force can easily overcome the bias force upon the protection ring as well as the distance between the wafer and support surface of the chuck. However, the protection ring continuously abuts the underside of the wafer during processing and insures that neither the plasma nor etchant polymers penetrate the circumferential contact region between the wafer and the protection ring. Thus, the plasma cannot contact the flex circuit or the pedestal. Furthermore, the contact region between the protection ring and the wafer, is very near the edge of the wafer; thus, the overhang region of the wafer that is exposed to the plasma is relatively small, as such, wafer processing yield is improved over that of the prior art.

Additionally, when etching wafers, and especially when etching wafers for sub half-micron integrated circuit fabrication, plasma non-uniformity contributes to plasma "charge-up" damage to the wafer. Such damage can substantially reduce the yield of the semiconductor wafer processing system. When a silicon protection ring (or other material having similar conductive properties to that of a wafer) is used in accordance with the present invention, the protection ring extends the effective surface of the wafer beyond the physical dimensions of the wafer. As such, the plasma is more uniformly distributed over the wafer and charge-up damage is substantially reduced.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
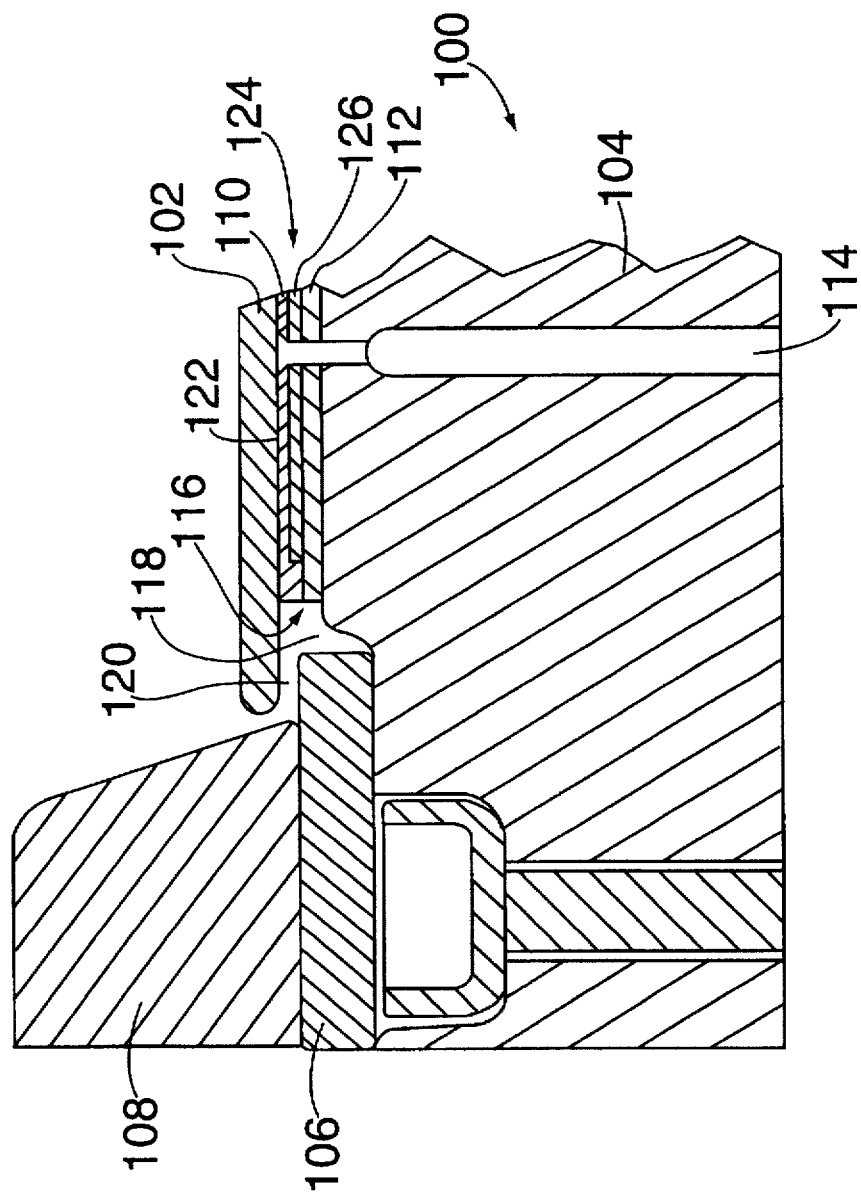
FIG. 1 depicts a cross-sectional view of a portion of a prior art electrostatic chuck supporting a process wafer.
Figure 2:
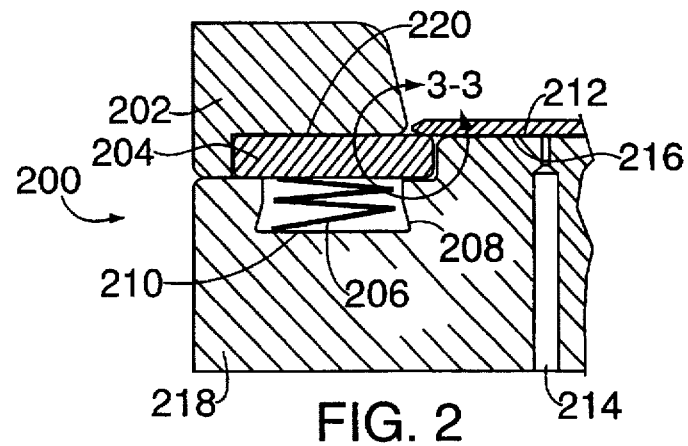
FIG. 2 depicts a cross-sectional view of a portion of a first embodiment of the improved electrostatic chuck in accordance with the present invention.
Figure 3:
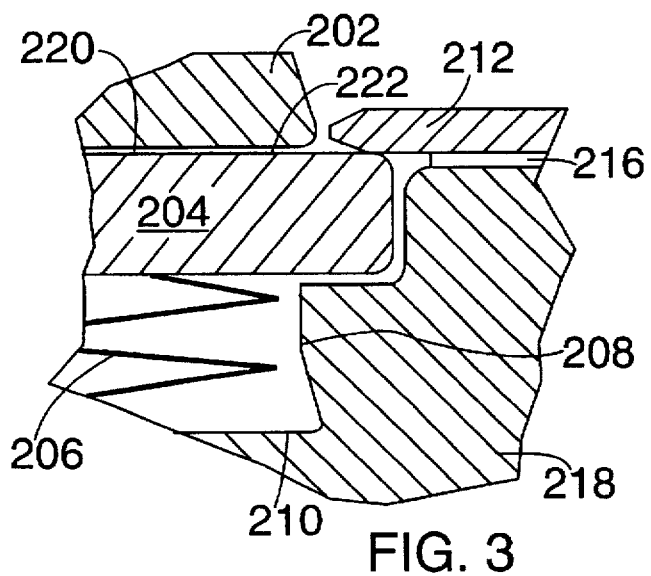
FIG. 3 depicts a detailed view of region 3—3 of FIG. 2 with the wafer in a chucked position.

FIG. 2 depicts a cross-sectional view of a portion of a first embodiment of the improved electrostatic chuck of the present invention. Since the electrostatic chuck is symmetrical about its central axis, for simplicity, only the left hand side of the chuck is depicted. FIG. 3 depicts a detailed view showing the detail of the invention within region 3—3 of FIG. 2. To best understand the invention, the reader should simultaneously refer to FIGS. 2 and 3 while reading the following disclosure.

The improved electrostatic chuck contains a flex circuit 216 supported by a pedestal 218. The flex circuit is fabricated in a conventional manner having at least one electrode sandwiched between two dielectric layers that are typically fabricated of a polyimide material. This flex circuit structure is adhered to the top surface of the pedestal using an adhesive such as phenolic butyral. The pedestal is typically fabricated of aluminum, but can be another material such as stainless steel. To achieve backside gas cooling, a backside gas conduit 214 is bored through the pedestal and the electrostatic chuck 216. The surface of the chuck may include gas distribution grooves that are formed in a conventional manner to facilitate uniform distribution of the backside gas beneath the wafer 212.

Although the flex circuit is illustratively described as a portion of this embodiment of the electrostatic chuck used in conjunction with the invention, those skilled in the art will understand that any form of electrostatic chuck may be used in combination with the invention. For example, the chuck may be formed using an aluminum pedestal or stainless steel pedestal supporting a dielectric layer that is fabricated of a ceramic material having one or more electrodes imbedded therein. Furthermore, the electrostatic chuck may be a monopolar chuck, a bipolar chuck, or a Johnson-Rahbek type chuck as well as powered by either AC or DC voltage.

The invention includes a vertically movable protection ring 204 having an annular plan form that circumscribes the flex circuit 216. The ring is fabricated from a plasma resistant material such as ceramic or silicon. The ring 204 has an inner diameter that is slightly (4 mm) smaller than the outer diameter of the wafer. As such, the protection ring 204 contacts the edge of the underside of the wafer 212 and, because the contact region extends completely around the wafer, insures that the plasma will not penetrate into the space proximate the pedestal or the flex circuit. To insure contact at all times with the backside of the wafer, the protection ring 204 is biased away from the pedestal and towards the wafer via a biasing element. In the first embodiment of the invention the biasing element is a plurality of springs 206 (e.g., three or six). Each spring is located within a bore 208 in the surface of the pedestal 218. Each spring contacts, at one end, the underside of the protection ring, and at the other end, the bottom 210 of a bore 208 in the surface of the pedestal 218. The plurality of springs (of which only one is depicted) bias the protection ring 204 upward with a force of approximately 1.5 to 3 pounds.

To ensure that the protection ring does not extend a great distance above the flex circuit, thus interfering with the electrostatic chuck clamping force, the focus ring 202 is formed with a "hard stop" against which the protection ring is biased before the clamping force is applied. In this first embodiment of the invention, the hard stop is a notched portion 220 of the bottom surface of the focus ring 202. The focus ring 202 rests upon the pedestal 218 and the notched portion extends over the insulating ring 204 thus restricting its vertical travel distance. Alternatively, other apparatus for limiting the vertical travel of the protection ring could be used.

Figure 4:
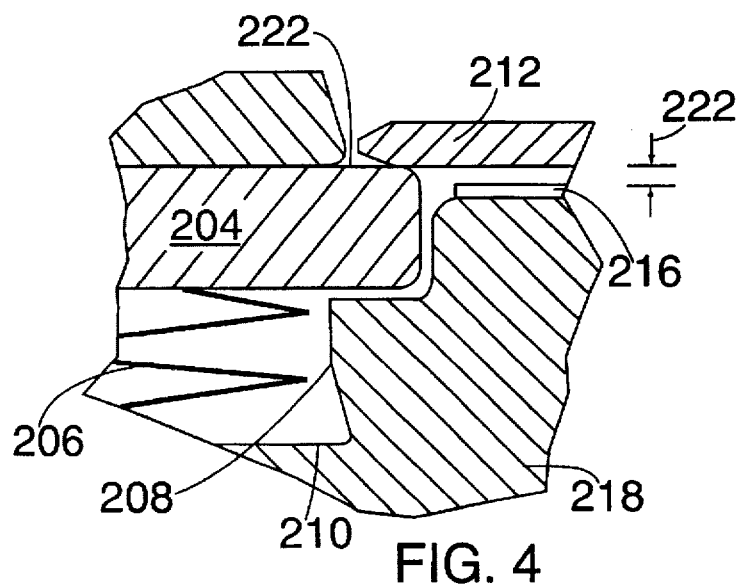
FIG. 4 depicts a detailed view of region 3—3 of FIG. 2 with the wafer in a loading position.

FIG. 4 depicts the first embodiment of the invention in a loading position, i.e., before the electrostatic chuck clamping force is applied to the wafer 212. In this loading position, the backside of the wafer 212 rests on the upper surface 222 of the protection ring 204 and is supported thereby above the electrostatic chuck flex circuit by 2 to 4 mils (0.05–0.10 mm). This distance (reference 222) is small enough to enable the clamping force of the chuck to overcome the biasing force and draw the wafer to the support surface of the chuck. The hard stop 220 ensures that the distance between the support surface and wafer is not too great to achieve chucking of the wafer 212. When the chucking voltage is applied to the electrostatic chuck flex circuit, the wafer is clamped and pulled towards the support surface of the electrostatic chuck. Consequently, the bias springs 206 are compressed and the protection ring moves downward as the wafer is clamped. In this manner, the protection ring 204 is assured contact with the outer edge of the process wafer at all times during processing. Thus, upon application of the clamping force, FIG. 4 becomes what is depicted in FIG. 3. The space between the hard stop and the protection ring is on the order of 2 to 4 mils. (0.05–0.10 mm) which is too small of a gap for the plasma to penetrate. Thus, the use of the protection ring in combination with the biasing element eliminates penetration of the plasma to the pedestal and/or the flex circuit. In addition, the use of the protection ring 204 ensures that the plasma only contacts the backside of the wafer proximate the edge of the wafer thus reducing the area of the wafer backside that is exposed to the plasma and reducing the number of devices that are damaged by backside contact with the plasma. Consequently, the improved electrostatic chuck increases the yield of the wafer processing system.

Figure 5:
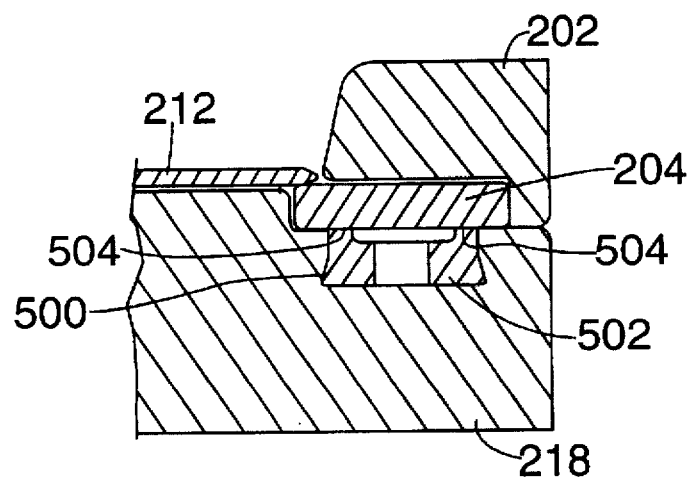
FIG. 5 depicts a cross-sectional view of a portion of a second embodiment of the present invention.

FIG. 5 depicts a cross-sectional view of a second embodiment of the present invention. Specifically, the second embodiment of the invention uses as the biasing element an elastomer ring(s). In this second embodiment, the bore 208 (of FIG. 2) is replaced by a circumferential slot or trough 500 that is milled into the surface of the pedestal 218. The trough circumscribes the pedestal at a diameter that is equivalent to the diameter of the protection ring 204. Into this trough is placed a biasing element that contains one or more elastomer rings 502. Each ring contains a lip seal 504 that contacts the underside of the protection ring 204, thus biasing the ring 204 upwards towards the underside of the wafer 212 with a force of 1.5 to 3 pounds. Each ring is fabricated from, for example, Chemraz available from Greene, Tweed & Co.

Figure 6:
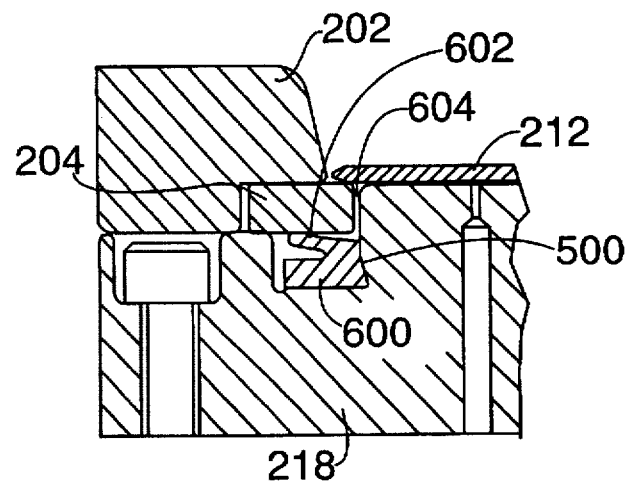
FIG. 6 depicts a cross-sectional view of a portion of a third embodiment of the present invention.

The third embodiment of the present invention depicted in FIG. 6, contains a single elastomer ring 600 positioned in the slot 500. The elastomer ring 600 biases the protection ring 204 towards the underside of the process wafer as well as provide a helium lip seal. Specifically, the elastomer ring contains a lip seal 602 that extends from the top surface of the ring 600. Consequently, in this configuration, the backside gas leaks from the underside of the wafer 212 into a space 604 between the protection ring 204 and the pedestal 218. As such, a fuller extent of the backside of the wafer is in contact with the backside cooling gas. Furthermore, contact of the backside cooling gas with the protection ring provides cooling for the ring itself.

Figure 7:
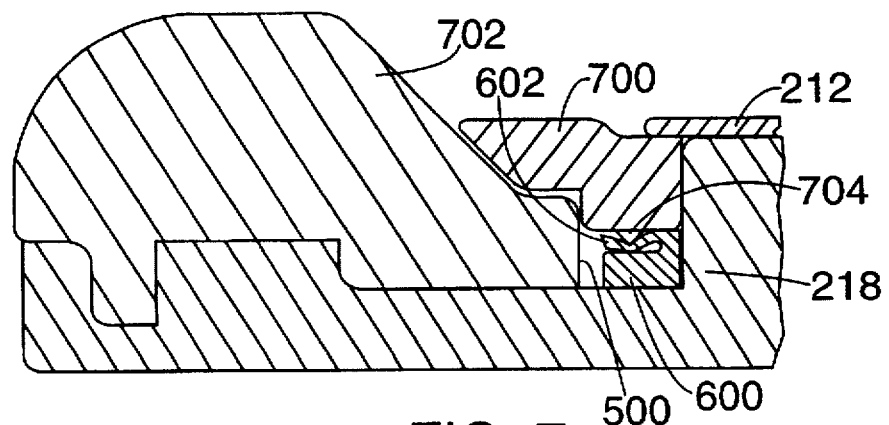
FIG. 7 depicts a cross-sectional view of a portion of a fourth embodiment of the present invention.

FIG. 7 depicts a cross-sectional view of a fourth embodiment of the present invention. As with the previous embodiments, this embodiment contains a pedestal 218, a bias element (elastomer ring 600) within slot 500, a protection ring 700, and a focus ring 702. The significant feature of this embodiment is the focus ring 702 does not for a hard stop. As such, the maximum travel of the protection ring 700 is limited only by the force of the lip seal 602 on the protection ring. The protection ring 700 contains a ridge 704 that interacts with the lip seal. Alternatively, the bottom surface of the ring could be flat (e.g., as shown in FIG. 6). The focus ring 702 and protection ring 700 have opposing surfaces having a spaced apart relation where the space between the surfaces is small enough to ensure that the plasma cannot penetrate beneath the protection ring.

Note that in all the embodiments of the present invention, the protection ring 204 or 700 is not in any way affixed to the pedestal or the focus ring. As such, the ring as well as its biasing element can be easily replaced during chamber servicing.

Use of the present invention to provide a "zero-gap" electrostatic chuck has resulted in a substantial improvement of the yield of semiconductor wafer processing system that utilizes plasma enhanced processing. Specifically, the protection ring of the invention ensures that neither the plasma nor polymer deposits penetrate into the region beneath the wafer and contact the flex circuit and/or the pedestal. As such, fewer contaminant particles are released into the process chamber, the life expectancy of the electrostatic chuck is increased, cleaning durations are reduced, polymer accumulation at the edge of the pedestal is eliminated, a wafer lip seal commonly used during etch processing to contain the backside cooling gas is no longer a consumable component, and a maximal area of the wafer is undamaged by backside plasma exposure. When a silicon protection ring (or other material having similar conductive properties to that of a wafer) is used the plasma is more uniformly distributed above the wafer. This improvement occurs because the silicon ring extends the effective wafer area, resulting in a plasma that extends beyond the physical edge of the wafer, e.g., to the outer edge of the protection ring or to the focus ring.

Although various embodiments which incorporate the teachings of the present invention have been shown and described in detail herein, those skilled in the art can readily devise many other varied embodiments that still incorporate these teachings.

What is claimed is:

1. Apparatus for supporting a wafer comprising:

a pedestal;

a protection ring having an inner diameter that is less than the outer diameter of the wafer; and a bias element, located between said pedestal and said protection ring for biasing said protection ring into contact with a surface of said wafer.

2. The apparatus of claim 1 further comprising:

an electrostatic chuck, affixed to said pedestal, for retaining said wafer upon said pedestal, where said protection ring circumscribes said electrostatic chuck.

3. The apparatus of claim 2 wherein said electrostatic chuck further comprises a flex circuit.

4. The apparatus of claim 1 further comprising a hard stop, abutting said protection ring, for restricting a vertical travel distance of said protection ring.

5. The apparatus of claim 4 wherein said hard stop is a focus ring supported by said pedestal and having an overhang portion that abuts said protection ring.

6. The apparatus of claim 1 wherein said biasing element is a plurality of springs.

7. The apparatus of claim 6 wherein each spring is located within a bore in said pedestal.

8. The apparatus of claim 1 wherein said biasing element is an elastomer ring.

9. The apparatus of claim 8 wherein said elastomer ring is located in a channel in said pedestal.

10. The apparatus of claim 1 wherein the protection ring is fabricated of ceramic or silicon.

11. Apparatus for retaining a wafer comprising:

a pedestal;

a protection ring having an inner diameter that is less than the outer diameter of the wafer;

a bias element, located between said pedestal and said protection ring for biasing said protection ring into contact with a surface of said wafer; and a focus ring supported by said pedestal and having an overhang portion that abuts said protection ring to restrict a vertical travel distance of said protection ring.

12. The apparatus of claim 11 further comprising:

an electrostatic chuck, affixed to said pedestal, for retaining said wafer upon said pedestal, where said protection ring circumscribes said electrostatic chuck.

13. The apparatus of claim 12 wherein said electrostatic chuck further comprises a flex circuit.

14. The apparatus of claim 11 wherein said biasing element is a plurality of springs.

15. The apparatus of claim 14 wherein each spring is located within a bore in said pedestal.

16. The apparatus of claim 11 wherein said biasing element is an elastomer ring.

17. The apparatus of claim 16 wherein said elastomer ring is located in a channel in said pedestal.

18. The apparatus of claim 11 wherein the protection ring is fabricated of ceramic or silicon.

19. Apparatus for supporting a wafer having a physical area comprising:

a pedestal;

a protection ring having an inner diameter that is less than the outer diameter of the wafer and an outer diameter that is larger than the diameter of the wafer, where the protection ring produces an effective wafer area that is larger than the physical area of the wafer; and a bias element, located between said pedestal and said protection ring for biasing said protection ring into contact with a surface of said wafer.

20. The apparatus of claim 19 wherein said biasing element is a plurality of springs.

21. The apparatus of claim 20 wherein each spring is located within a bore in said pedestal.

22. The apparatus of claim 19 wherein said biasing element is an elastomer ring.

23. The apparatus of claim 22 wherein said elastomer ring is located in a channel in said pedestal.

24. The apparatus of claim 19 wherein the protection ring is fabricated of silicon.

* * * * *